United States Patent
Miller (10) Patent No.: US 10,374,128 B2
(45) Date of Patent: Aug. 6, 2019

(54) ELECTRICAL CONTACTS TO LIGHT-EMITTING DIODES FOR IMPROVED CURRENT SPREADING AND INJECTION

(71) Applicant: TERAHERTZ DEVICE CORPORATION, Salt Lake City, UT (US)

(72) Inventor: Mark S. Miller, Salt Lake City, UT (US)

(73) Assignee: Terahertz Device Corporation, Salt Lake City, UT (US)

(*) Notice: Subject to any disclaimer, the term of this patent is extended or adjusted under 35 U.S.C. 154(b) by 12 days.

(21) Appl. No.: 15/103,150

(22) PCT Filed: Dec. 12, 2014

(86) PCT No.: PCT/US2014/070076
§ 371 (c)(1),
(2) Date: Jun. 9, 2016

(87) PCT Pub. No.: WO2015/089432
PCT Pub. Date: Jun. 18, 2015

(65) Prior Publication Data
US 2016/0322537 A1    Nov. 3, 2016

Related U.S. Application Data

(60) Provisional application No. 61/915,398, filed on Dec. 12, 2013.

(51) Int. Cl.
*H01L 33/08* (2010.01)
*H01L 33/30* (2010.01)
(Continued)

(52) U.S. Cl.
CPC .............. *H01L 33/38* (2013.01); *H01L 33/08* (2013.01); *H01L 33/30* (2013.01); *H01L 33/40* (2013.01);
(Continued)

(58) Field of Classification Search
CPC ......... H01L 27/15; H01L 33/08; H01L 33/36; H01L 33/38; H01L 33/62
(Continued)

(56) References Cited

U.S. PATENT DOCUMENTS

2002/0158572 A1    10/2002    Chen et al.
2005/0045978 A1*   3/2005    Zoefl .................. H01L 33/145
                                                                 257/428

(Continued)

OTHER PUBLICATIONS

International Search Report and Written Opinion for PCT Application No. PCT/US20141070076, dated Mar. 31, 2015.

*Primary Examiner* — Lex H Malsawma
*Assistant Examiner* — Eric W Jones
(74) *Attorney, Agent, or Firm* — Ray Quinney & Nebeker P.C.; Paul N. Taylor (57) ABSTRACT

An optoelectric device can comprise a substrate and at least one junction configured to provide an active region within the substrate. Additionally, the device can comprise a metal-mesh semiconductor electrical contact structure attached to a surface of the substrate. The metal-mesh semiconductor electrical contact structure can further comprise a mesh line width, a mesh opening size, and a mesh thickness.

20 Claims, 5 Drawing Sheets

(51) Int. Cl.
  *H01L 33/38* (2010.01)
  *H01L 33/40* (2010.01)
  *H01L 33/62* (2010.01)
  *H01L 51/52* (2006.01)
  *H01L 51/56* (2006.01)

(52) U.S. Cl.
  CPC .......... *H01L 33/62* (2013.01); *H01L 51/5203* (2013.01); *H01L 51/56* (2013.01); *H01L 2933/0016* (2013.01); *H01L 2933/0066* (2013.01)

(58) Field of Classification Search
  USPC .................................................. 257/9, 11–14
  See application file for complete search history.

(56) References Cited

U.S. PATENT DOCUMENTS

| | | | |
|---|---|---|---|
| 2006/0175960 A1* | 8/2006 | Noh | H01L 27/3209 313/505 |
| 2006/0205313 A1* | 9/2006 | Fink | H01J 9/148 445/24 |
| 2006/0237735 A1 | 10/2006 | Naulin et al. | |
| 2007/0034852 A1* | 2/2007 | Nelson | B82Y 20/00 257/13 |
| 2007/0108888 A1* | 5/2007 | Chen | B82Y 20/00 313/503 |
| 2009/0114928 A1 | 5/2009 | Messere et al. | |
| 2009/0212307 A1* | 8/2009 | Baur | H01L 33/38 257/98 |
| 2010/0203235 A1* | 8/2010 | Verschuuren | H01L 51/5206 427/66 |
| 2010/0258796 A1* | 10/2010 | Horio | H01L 33/28 257/43 |
| 2011/0037054 A1 | 2/2011 | Shieh et al. | |
| 2013/0001507 A1* | 1/2013 | Cheng | H01L 21/0237 257/9 |
| 2013/0153856 A1 | 6/2013 | Das | |
| 2013/0320322 A1* | 12/2013 | Muto | H01L 51/0021 257/40 |
| 2015/0179872 A1* | 6/2015 | Zhang | H01L 33/04 257/43 |
| 2016/0035931 A1* | 2/2016 | Zhurtanov | H01L 33/12 257/76 |

\* cited by examiner

ELECTRICAL CONTACTS TO LIGHT-EMITTING DIODES FOR IMPROVED CURRENT SPREADING AND INJECTION

CROSS REFERENCE TO RELATED APPLICATIONS

This application is a U.S. Nationalization of PCT Application Number PCT/US2014/070076, filed on Dec. 12, 2014, which claims priority to U.S. Provisional Application No. 61/915,398 entitled "ELECTRICAL CONTACTS TO LIGHT-EMITTING DIODES FOR IMPROVED CURRENT SPREADING AND INJECTION," filed Dec. 12, 2013, which are herein incorporated by reference in their entireties.

BACKGROUND

The use of doped semiconductors to create barriers, injectors, tunnel junction contacts, cascade LED junction, and other related device has long been known in the art. Specially, conventional semiconductor materials can be comprised of doped semiconductor layers placed into contact with each other to create one or more p-n junctions. In the case of light emitting diodes (LEDs), as electrical current is applied to the junctions, electrons and holes combine with each and emit photons. The energy contained in the emitted photos corresponds to the energy difference between the respective holes and electrons.

Small, lithographically patterned metal contact structures on the semiconductor layers supply the current to be injected into the junction. The electrical resistance of the injecting semiconductor layers, though, can inhibit the uniform spread of current across the junction surface away from the metal contact. Completely covering the surface, instead, with a low-resistance metal contact layer to spread out the current can block light generated in the crystal from being extracted.

Accordingly, there are a number of improvements that can be made within the art.

BRIEF SUMMARY

Embodiments of the present invention comprise systems, methods, and apparatus configured to improve the spread of current evenly across an LED device junction and lessen the blocking of light extracted from the LED with a metallic contact. Embodiments of the structures accomplish the improvements through combinations of decreasing the average contact spreading resistance and increasing the junction injection resistance. At least one embodiment includes composite metal-mesh semiconductor contacts used for decreasing the spreading resistances. Another embodiment includes cascaded LED light emission junctions used to increase the junction injection resistance.

For example, embodiments of the present invention can include an optoelectric device that comprises a substrate and at least one junction configured to provide an active region within the substrate. Additionally, the device can comprise a metal-mesh semiconductor electrical contact structure attached to a surface of the substrate. The metal-mesh semiconductor electrical contact structure can further comprise a mesh line width, a mesh opening size, and a mesh thickness.

Additional embodiments can include a light emitting diode that comprises at least one substrate. The substrate can comprise a semiconducting material that emits light in a mid-infrared portion of the electromagnetic spectrum. Additionally, the light emitting diode can comprise a plurality of cascaded LED emission junctions. Further, the light emitting diode can comprise a metal-mesh semiconductor electrical contact structure attached to a surface of the substrate. In at least one embodiment, the metal-mesh semiconductor electrical contact structure comprises a plurality of uniform mesh line widths, a plurality of uniform mesh opening sizes, and a plurality of uniform mesh thicknesses.

Further, an embodiment of the present invention can include a method for manufacturing a metal-mesh semiconductor electrical contact structure for a light-emitting diode. The method can comprise determining an operating current of the light-emitting diode. The method can also comprise determining a size of the light-emitting diode. Additionally, the method can comprise calculating a metal thickness for the metal-mesh semiconductor electrical contact structure such that a spreading length for a composite contact is greater than the size of the light-emitting diode. Further, the method can comprise creating the metal-mesh semiconductor electrical contact structure with the calculated thickness. The metal mesh semiconductor electrical contact structure can also comprise a wire width and a mesh opening width.

Additional features and advantages of exemplary embodiments of the invention will be set forth in the description which follows, and in part will be obvious from the description, or may be learned by the practice of such exemplary embodiments. The features and advantages of such embodiments may be realized and obtained by means of the instruments and combinations particularly pointed out in the appended claims. These and other features will become more fully apparent from the following description and appended claims, or may be learned by the practice of such exemplary embodiments as set forth hereinafter.

BRIEF DESCRIPTION OF THE DRAWINGS

In order to describe the manner in which the above recited and other advantages and features of the invention can be obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

The present invention extends to systems, methods, and apparatus configured to improve the spread of current evenly across an LED device junction and lessen the blocking of light extracted from the LED with a metallic contact. Embodiments of the structures accomplish the improvements through combinations of decreasing the average contact spreading resistance and increasing the junction injection resistance. At least one embodiment includes composite metal-mesh semiconductor contacts used for decreasing the spreading resistances. Another embodiment includes cascaded LED light emission junctions used to increase the junction injection resistance.

In various embodiments of optoelectric devices, the compromise between current spreading and light extraction depends on the relative resistances encountered for current spreading and current injecting. In particular, the injection resistance can depend to a large degree on the width of the energy bandgap of the semiconducting material. Because the bandgap also determines the wavelength of emitted light, it is not always ideal to simply minimize the width of the bandgap. For example, longer wavelengths come from narrower energy bandgaps, which have correspondingly smaller injection resistances. In contrast, shorter wavelengths come from wider energy bandgaps, which have correspondingly larger injection resistances.

Additionally, in various embodiments, the spreading resistance depends on the properties of the particular semiconductor material. In at least some cases, wider bandgap materials have higher resistances. Conversely, at least some of the narrow bandgap materials have lower resistances. Accordingly, an engineer can create various device configurations based on different semiconductor material systems and metals operating at different wavelengths and thus requiring different compromises.

Figure 1:
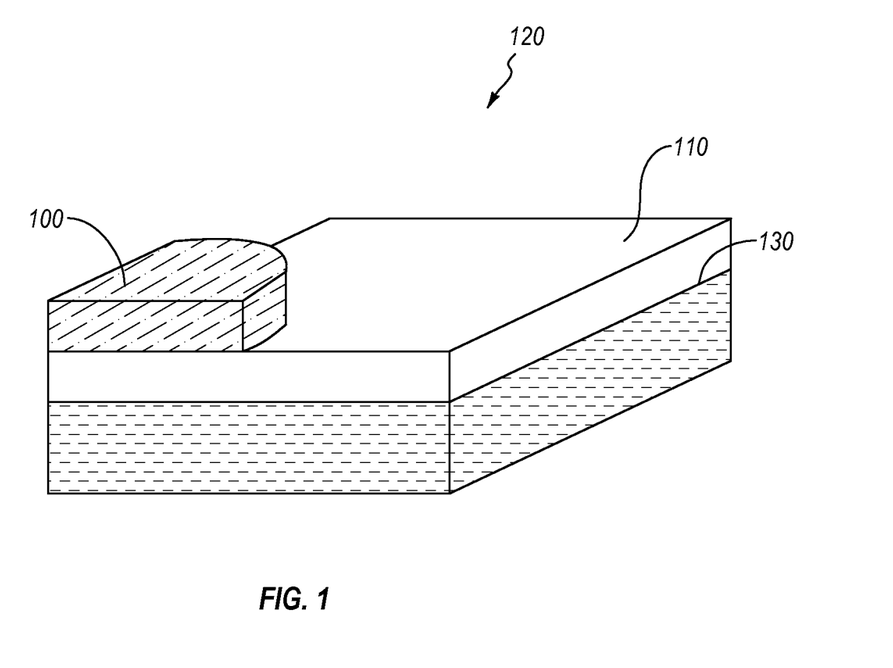
FIG. 1 illustrates an embodiment of a metal contact on a surface of an LED device.

For example, in at least one embodiment, an engineer may design a particular metal contact for an optoelectric device. In various embodiments, the designed contact can impact the spreading resistance and/or the injection resistance. As an exemplary embodiment, FIG. 1 illustrates a simple metal contact 100 to the n-type layer 110 of an LED 120. Specifically, current from the contact 100 can flow from the metal into the n-type layer 110 for injection into the pn junction 130. One will understand that the metal contact 100 may block at least a portion of the light from being extracted from the LED 120. In at least one embodiment, the metal contact 100 in this example also serves as a wire bond pad.

Figure 2A:
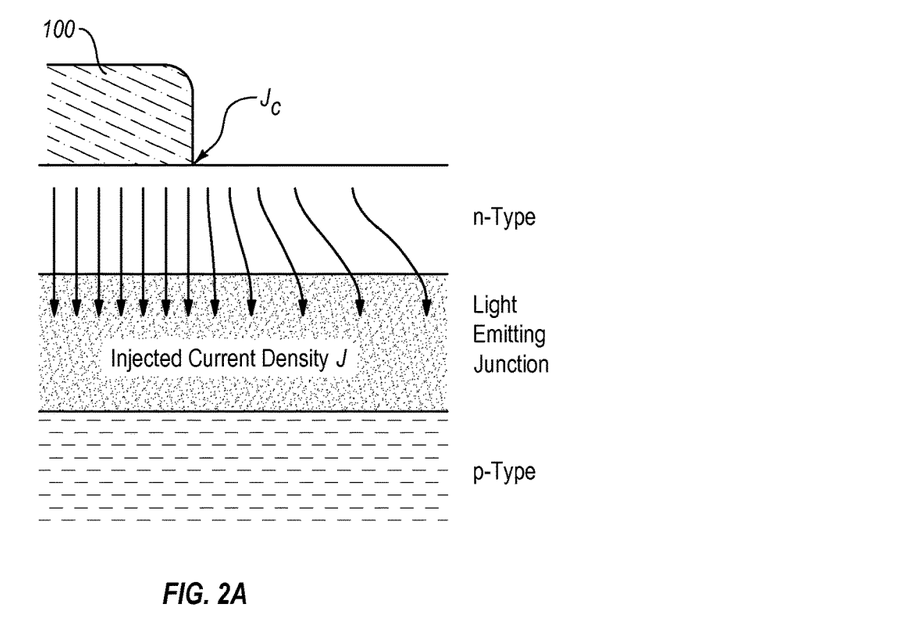
FIG. 2A illustrates an embodiment of current spreading from a metal contact into the surface of an LED device.
Figure 2B:
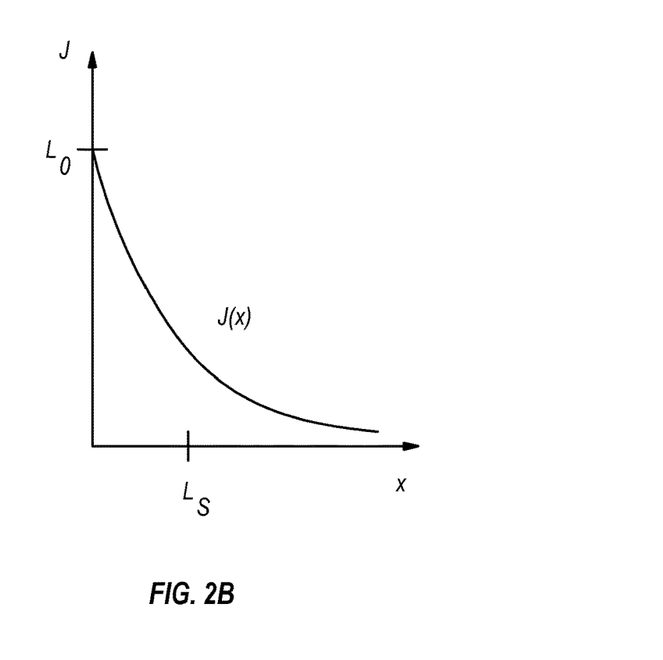
FIG. 2B depicts a graph describing current spreading over a distance.

FIG. 2A depicts a current spreading length, $L_s$, for an embodiment of the metal contact 100 depicted in FIG. 1. In particular, the spreading length, $L_s$, characterizes how the injected current density supplied from the metal contact 100 decreases away from the metal contact 100. Starting with an initial value $J_c$ at the contact edge and with x corresponding to relative position, the current value is depicted in FIG. 2B and can be expressed as $$J(x) = J_c e^{-x/L_s}. \quad (1)$$

The horizontal conduction depends on the semiconductor contact layer sheet resistance of $R_s$. The vertical conduction depends on the specific contact junction resistance $R_j(V)$, which depends on $J(x)$ and the potential V. The current density depends on the potential as $$J(x) = J_s e^{V/\eta V_t}. \quad (2)$$

with $J_s$ the diode saturation current, $\eta$ the ideality factor, and $V_t$ the thermal voltage. The specific contact junction resistance is $$R_j(V) = \left(\frac{\partial J}{\partial V}\right)^{-1} = \frac{\eta V_t}{J_c(V)}. \quad (3)$$

The spreading length for the contacted LED junction is $$L_s = \sqrt{\frac{2\eta V_t}{J_c R_s}} = \sqrt{2\frac{R_j}{R_s}}. \quad (4)$$

When designing a mid-infrared LED, InAs, GaSb, AlSb, and related alloys are often used due to the narrow energy bandgaps that can be fabricated from structures of these materials. The mid-infrared portion of the spectrum considered here may include wavelengths in the range of approximately 2 μm to 20 μm. Various light emitting junctions have been fabricated with these materials, with junction examples including bulk alloy layers, quantum wells, and superlattices.

In at least some embodiments, InAs and closely related alloys have very high n-type conductivity, which can greatly reduce spreading resistance to improve injection uniformity. In some cases, the rapidly decreasing injection resistance with increasing wavelength can result in poor enough uniformity to make long wavelength devices impractical. For example, in V. K Malyutenko, et al., Semiconductor Science and Technology, vol. 23, June (2008) pp. 085004-085007, which is incorporated herein by reference in its entirety, it was found that current did not spread for LEDs with bulk alloy junctions for wavelengths of 4.2 μm and greater, with the metal contact blocking most of the LED light. Simple models show there may not be a practical compromise between metal contact coverage and light extraction efficiency for longer wavelengths using only simple contact structures.

Similarly, when designing LEDs that operate in the blue to ultraviolet portion of the electromagnetic spectrum, GaN, InN, AlN, and related alloys are often used because of the wide energy bandgaps that can be fabricated from structures of these materials. The blue to ultra-violet portion of the spectrum considered here includes wavelengths in the range of approximately 0.2 μm to 0.5 μm. Various light emitting to junctions can be fabricated with these materials, with junction examples including bulk alloy layers, quantum wells, and superlattices.

In at least one embodiment, injection resistance increases with decreasing wavelength for these nitride-based semiconducting materials. This attribute can lead to improved injection uniformity. In contrast, the lower electrical conductivity of these materials and corresponding constraints on contacting metal materials, especially for the p-type wide bandgap nitride semiconductors, can lead to higher spreading resistances and poorer LED performance due to the compromise between metal contact coverage and light extraction efficiency. At least one embodiment of an LED design compromise is described by Kim, et al., IEEE Journal of Quantum Electronics, VOL. 43, NO. 8, August 2007, pp. 625-632, which is incorporated herein by reference in its entirety. Kim teaches a fabricated GaN-based LED with semi-transparent metal contact layers that were thin enough to permit some light to escape but still conductive enough to improve current spreading.

In addition to the GaN, InN, AlN and the InAs, GaSb, AlSb LEDs described above, several organic materials may be used to construct light emitting diodes. Typically organic materials are used for their light emission in the visible spectral range for video displays or for general illumination. These organic semiconducting materials often have low electrical conductivity, such that some higher-conductivity current spreading structure needs to be fabricated to spread out the current without blocking or absorbing light. As one example, layers of conductive indium-tin-oxide are used as a compromise between spreading resistance, light extraction, and fabrication costs.

Typically, the light emitting junction in an LED is formed between an n-type semiconductor layer that supplies negatively charged electrons for injection and a p-type layer that supplies positively-charged holes for injection. Additionally, in some embodiments, n-type and p-type layers can be brought together to form a tunnel junction that uses quantum tunneling to give instead a low-resistance electrical contact between the layers for conduction without light emission. In at least one embodiment of the present invention, alternating tunnel junctions with light emitting junctions can be used to stack successive light emitting p-n junctions to give a cascade of light emitting junctions. Pushing an electrical current through the cascade can produce light in each stage of the cascade. Cascaded LED structures can provide various design benefits, such as adjusting the device operating voltage to match its electrical properties to external power supply and control circuitry. Cascaded LED structures can also be used to improve efficiency by mitigating problems due to device series resistance. For example, Akyol, et al., Applied Physics Letters, vol. 103, issue 8, pp. 081107-081109 (2013), which is incorporated herein by reference in its entirety, teaches a GaN LED with cascading tunnel junctions.

At least one embodiment disclosed herein provides structures directed at ensuring evenly injected current across an LED device without blocking too much light extraction. Additionally, at least one embodiment of a metal-mesh semiconductor composite contact structure can spread current evenly across the device and within the mesh openings by simultaneously controlling the current spreading length across the device and the current crowding within a mesh opening. Further, at least one embodiment of a cascaded LED structure can spread current evenly by increasing the junction injection resistance.

For the sake of clarity and simplicity, one or more of the embodiments disclosed herein are described using the three concepts of a current spreading length, current crowding, and the average electrical properties of a metal mesh. These three concepts are summarized in the following paragraphs using notation suitable for describing at least one embodiment of improved LED contacts of this invention.

Figure 3:
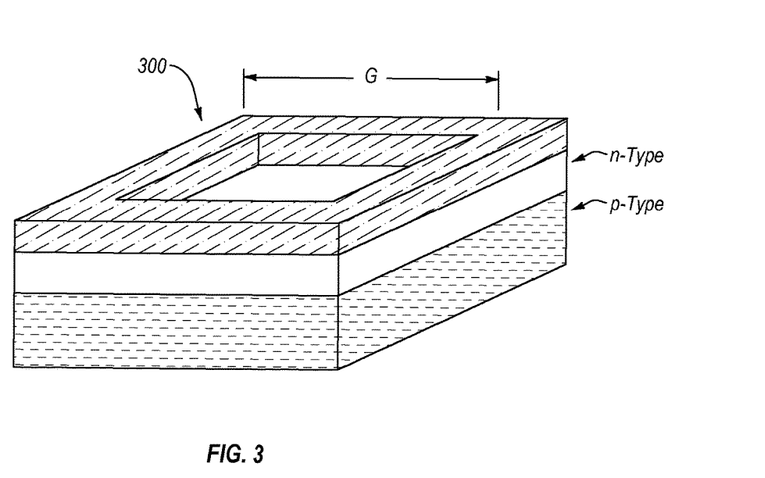
FIG. 3 depicts an embodiment of an annular metal contact.

To describe current crowding for LEDs, FIG. 3 depicts an example of an LED with a square annular metal contact 300 to the n-type layer around the device perimeter. Spreading resistance causes the potential V to decrease within the contact opening. The injected current density J depends exponentially on V, and the non-uniformly injected current crowds near the contact. Adapting analysis for current crowding in bipolar transistors to LEDs, and using the example of a square LED region with side length G, a current crowding parameter $\eta_{cc}$, for a total junction current $I_G$ may be defined as $$\eta_{cc} = \frac{R_s}{32} \frac{I_G}{\eta V_t}. \tag{5}$$

(For a circular region, the analysis results in the factor of 32 being replaced by the factor $8\pi$.) If the current density at the perimeter is given by $J_c$, then the average current density is $$J_G = \frac{I_G}{G^2} = \frac{J_c}{1+\eta_{cc}}. \tag{6}$$

The injected junction current density at the center of the region is reduced from that at the contacted perimeter by a factor of $1/(1+\eta_{cc})^2$. Therefore, designing and implementing a value of $\eta_{cc} < 0.05$, for example, should result in less than a 5% average current density reduction from that at the perimeter and less than a 10% current density reduction at the region center.

Figure 4:
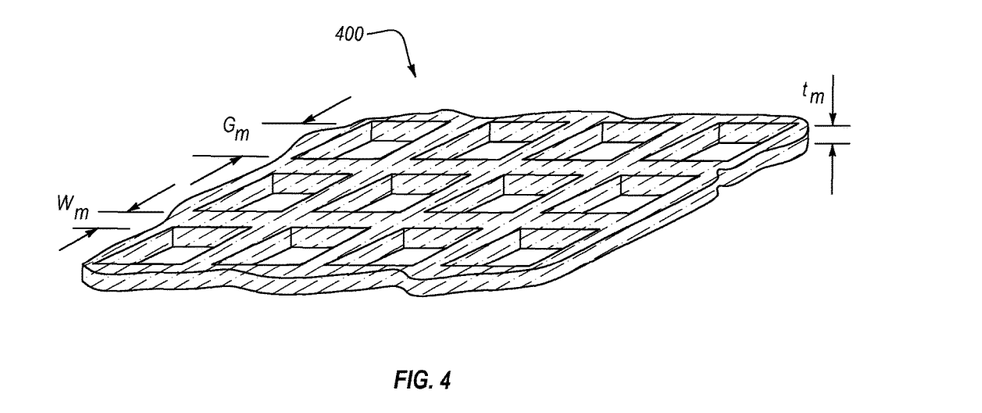
FIG. 4 depicts an embodiment of a metal mesh contact.

FIG. 4 depicts an example of a square metal mesh 400 that can be used to describe the average electrical properties of a metal mesh 400 for use with LEDs. As indicated in the figures, the width of each uniform metal line is $W_m$ and each mesh hole opening has side lengths of $G_m$. Accordingly, the mesh period is then $P_m = W_m + G_m$.

A mesh filling factor $f_m$ may be defined that gives the average surface coverage of the mesh to be $$f_m = \frac{W_m}{G_m + W_m}. \tag{7}$$

If the metal thickness is $t_m$ and the metal electrical resistivity $\rho_m$, then the average sheet resistance $R_m$ of this metal mesh grid is $$R_m = \frac{\rho_m}{t_m} \frac{1}{f_m}. \tag{8}$$

Figure 5:
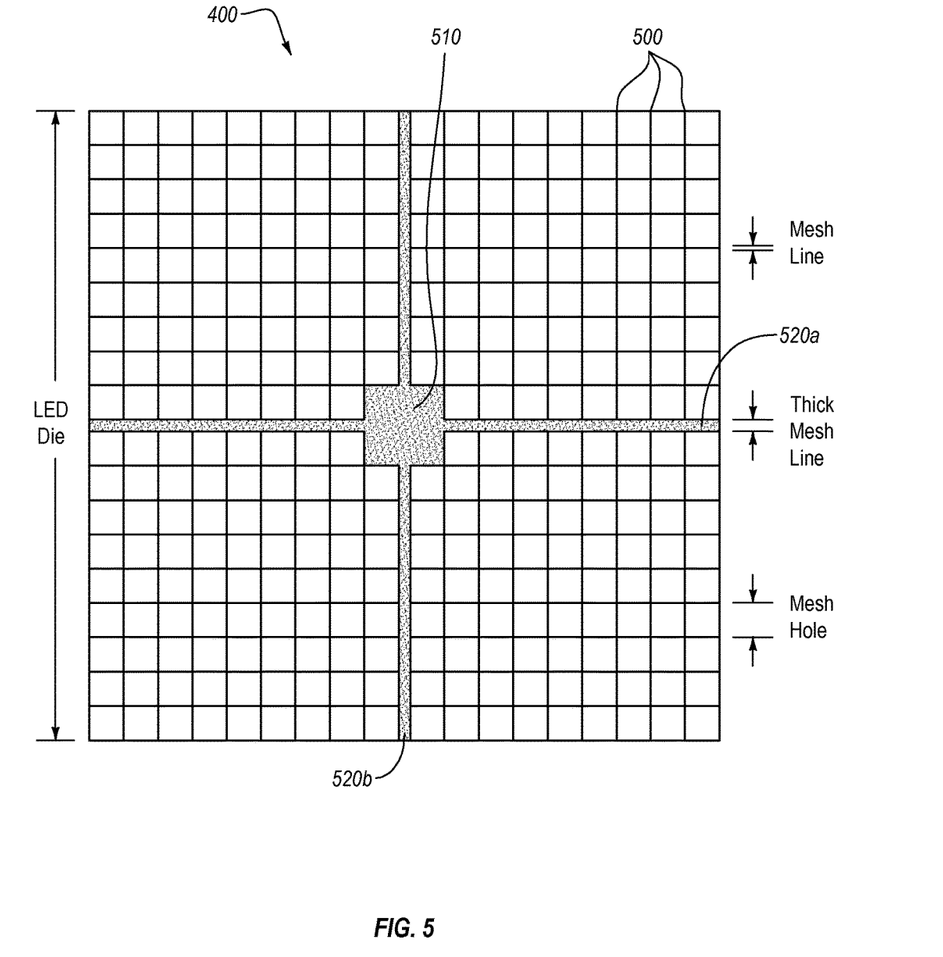
FIG. 5 depicts another embodiment of a metal mesh contact.

FIG. 5 depicts an embodiment of a metal-mesh semiconductor composite contact 400 for an LED. In particular, the metal-mesh semiconductor composite contact 400 comprises a square metal mesh with uniform metal lines 500, a central wire bonding pad 510, and two thicker metal mesh lines 520a, 520b to accommodate the distribution of larger currents to the semiconductor without overwhelming the connection.

In at least one exemplary embodiment, the compromise between current spreading and light extraction blocking calls for the metal mesh to have an average coverage $f_m$ of approximately 5%. Designing a desired LED may comprise choosing an operating current $I_0$ and the size of the device $L_{LED}$ to balance total output power with efficiency. Together these parameters determine the specific injection resistance $R_j$.

In at least one embodiment, the sheet resistance $R_s$ of the semiconductor contact layer may be fixed by the semiconductor material choice for the emission wavelength and by the semiconductor contact layer thickness. The metal choice fixes the metal resistivity $\rho_m$. The metal thickness $t_m$ and the mesh opening G of the composite mesh contact can then be chosen subject to these constraints and choices, as described below.

Embodiments disclosed herein also include metal mesh contacts comprised of mesh geometries other than square meshes, such as hexagonal lattices, diamond shaped lattices, circular openings, or any other shape. Additionally, other embodiments may also include other combinations of mesh and semiconductor geometry and parameter values being adjusted instead of the metal thickness $t_m$ and mesh opening G.

In the embodiment of FIG. 5, the metal mesh thickness $t_m$ has been adjusted to ensure that the spreading length for the composite contact, $L_{sm}$, is greater than the size of the device, $L_{LED}$. The average sheet resistance of the composite metal-mesh-semiconductor contact structure is determined by the average sheet resistance of the mesh $R_m$. The average spreading length across the device die is then $$L_{sm} = \sqrt{2\frac{R_j}{R_m}} = \sqrt{2\frac{t_m f_m R_j}{\rho_m}}. \tag{9}$$

The mesh spreading length can be designed for the intended range of operating current densities, because the specific junction contact resistance depends on the operating current density $J_c$ of the LED. The spreading length design criterion is met with metal thickness of $$t_m > \frac{\rho_m}{2f_m R_j} L_{LED}^2 = \frac{\rho_m I_0}{2 f_m \eta V_t}. \tag{10}$$

In the embodiment of FIG. 5, the square metal mesh opening size G can be adjusted to ensure that the current crowding parameter $\eta_{cc}$ is kept sufficiently small. Within an opening in the mesh, the local contact sheet resistance will be the sheet resistance of the semiconducting contact layer, $R_s$. The mesh size meeting these constraints may comprise a relationship $$G < \sqrt{\frac{1+\eta_{cc}}{J_c} I_G} = 4L_s \sqrt{\eta_{cc}(1+\eta_{cc})}. \tag{11}$$

For the embodiments disclosed herein, these equations show the current crowding can be controlled by reducing the mesh hole size in order to reduce $I_G$. The design accommodates the total device current $I_0$ by using the appropriate number of mesh periods $M_G$, $$I_0 = \frac{L_{LED}^2}{P_m^2} I_G \approx M_G I_G. \tag{12}$$

Figure 6:
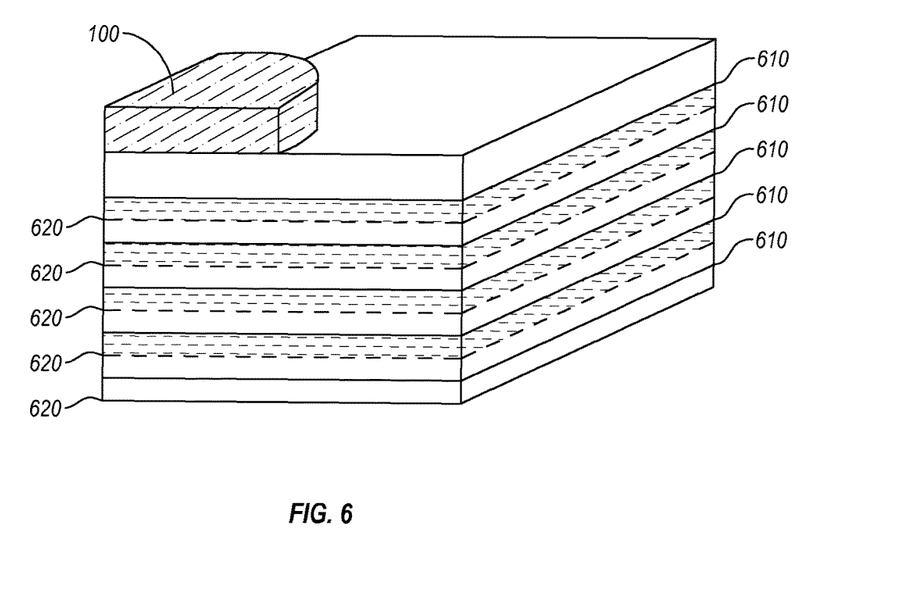
FIG. 6 depicts an embodiment of cascaded LED junctions.

FIG. 6 depicts an embodiment of a simple metal contact 100 to the topmost n-type layer of an LED with emission junctions 610 cascaded with tunnel junctions 620 in order to better spread the injection current. The example of FIG. 6 comprises N=5 cascaded emission junctions. The cascaded junctions improve spreading by increasing the injection resistance $R_j$. The forward injected current density for a cascade of N LED pn-junctions, each with the same ideality factor n, may be approximated as $$J_{cN} = J_{sC}^{V/\eta N V_t}. \tag{13}$$

The specific junction contact resistance $R_{jN}$ for the N-cascade becomes, $$R_{jN}(V) = \frac{\eta N V_t}{J_{cN}(V)} = N R_j(V). \tag{14}$$

For a semiconductor contact sheet resistance of $R_s$, the improved spreading length $L_{sN}$ for the cascaded junction is $$L_{sN} = \sqrt{2\frac{R_{jN}}{R_s}} = \sqrt{N} L_s. \tag{15}$$

A cascade of N stages increases the LED device spreading length by a factor of √N (square root of N). For a given contact electrode geometry, the embodiment reduces non-uniform current density injection and current crowding. Alternatively, a longer spreading length due to cascading means that contacting electrodes may be spaced farther apart.

Figure 7:
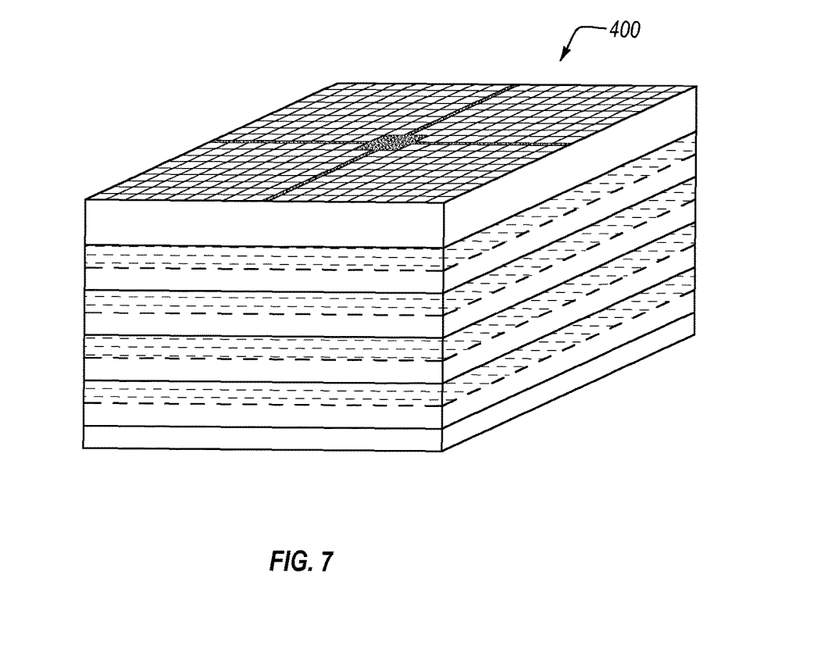
FIG. 7 depicts an embodiment of a metal mesh incorporated into a cascaded LED device.

FIG. 7 depicts an embodiment of the present invention that comprises a composite metal-mesh-semiconductor contacts and cascaded LED emission junctions. The improvements within this embodiment may increase with the number N of cascaded junctions. As such, this, and similar embodiment, may allow for meshes with combinations of a thinner metal layer, a lower mesh filling factor, and larger mesh openings.

As an example, while holding the mesh filling factor $f_m$ and other parameters constant, then the die-scale spreading length design criterion can be met by adjusting the metal thickness of the contact to the cascade $t_{mN}$ such that $$t_{mN} > \frac{\rho_m I_0}{2f_m \eta N V_t} = \frac{1}{N} t_m. \tag{16}$$

This expression shows that the required metal thickness is reduced by a factor 1/N. Alternatively, the average metal coverage may be reduced by the cascade to $f_{mN}$ to allow more light to escape:

$$f_{mN} > \frac{1}{N} \frac{\rho_m I_0}{2t_m \eta V_t} = \frac{1}{N} f_m. \tag{17}$$

The cascading also allows for a larger mesh opening. For example, holding other geometrical and device operating parameters constant, the required mesh size for the cascaded device is reduced by a factor of √N (square root of N).

$$G_N < 4L_{sN}\sqrt{\eta_{cc}(1+\eta_{cc})} = \sqrt{N} G. \tag{18}$$

This expression shows the mesh opening can be larger by a factor of √N (square root of N).

Additionally, embodiments disclosed herein can include metal-mesh composite contacts to mid-infrared LEDs comprised of cascaded emission junctions made with semiconductor heterostructure layers of InAs, GaSb, AlSb, and related alloys. For example, the mesh contact of FIG. 7 may comprise material and geometric parameters adjusted for cascaded mid-infrared LEDs.

The cascaded light emission stages for these LEDs can comprise superlattices, made with InAs and GaSb or related alloys, or quantum well structures made from similar materials. The semiconducting current spreading layer for the mid-infrared embodiment with sheet resistance $R_s$ can comprise either an n-type layer of InAs or closely related alloy or a p-type layer of GaSb or closely related alloy. The metal mesh contact to the n-type InAs current spreading layer can be comprised of a first layer of Ti or similar metal for adhesion, Pt for an Au diffusion barrier, and finally Au for current carrying and wire bonding, which effective determines the metal resistivity $\rho_m$.

In at least one embodiment, FIG. 7 adjusted for mid-infrared LEDs may comprise mesh openings of 50 μm, fine mesh lines 5 μm wide and a metal layer thickness of 1 μm. Additionally, in at least one embodiment the mesh makes electrical contact to an LED with N=10 cascaded junctions, chosen to meet goals of efficiency, output power and operating voltage. These cascaded stages can operate at a current density $J_c$=100 A/cm2 and a square die of size $L_{LED}$=1 mm, for a total current I0=1 A, with an ideality factor of $\eta$=1.5.

Within a mesh opening, the current crowding tolerance may be $\eta_{cc}$=1%. The n-type InAs current spreading layer can comprise a sheet resistivity of $R_s$=20Ω/☐ and the metal resistivity may be approximately that of gold, $\rho_m$=3.2×10−6 Ωcm. Additionally, the metal mesh of FIG. 7 can have an areal coverage of $f_m$=10%. The metal mesh thickness can meet the requirement of Eq. (16), which specifies a thickness of $t_m$>410 nm, ensuring an average mesh spreading length $L_{sN}$>1 mm. The mesh opening satisfies the general embodiment requirement of Eq. (18), which for the current crowding goal specifies $G_N$<79 μm.

Various embodiments of FIG. 7 for mid-infrared LEDs can also include a central bond pad for wire bonding and four thicker metal mesh lines of 20 μm widths extending from the bond pad to accommodate the distribution of larger currents across the device area without damaging the finer mesh lines. The thicker lines may ensure that if the total operating current $I_0$ flows through the mesh lines connected to the pad, then the current density in the metal is kept below the current density of 2×106 A/cm^2 known to result in gold metal line failure.

At least one embodiment depicted by FIG. 7 for mid-infrared LEDs has parameters for contacting a particular LED device. The equations that describe the general embodiment include the variations in the parameters for different device parameters such as operating current, number of cascades, and sheet resistance of the semiconductor current spreading sheet resistivity.

Embodiments of FIG. 7 may also include metal-mesh composite contacts to visible and ultraviolet nitride LEDs comprised of cascaded emission junctions made with semiconductor heterostructure layers of GaN, InN, AlN, and related alloys. FIG. 7 gives an example mesh contact with material and geometric parameters adjusted for visible or ultraviolet wavelength nitride LEDs. The cascaded light emission stages for these LEDs are comprised either of superlattices, made with GaN and InGaN or related alloys, or of quantum well structures made from similar materials.

The semiconducting current spreading layer for the nitride LED embodiment with sheet resistance $R_s$ comprises either an n-type layer of GaN or closely related alloy or a p-type layer of GaN or closely related alloy. The metal mesh contact to the n-type GaN current spreading layer is comprised of typical metal layers used for contact to n-GaN, such as a first layer of Ti or similar metal for adhesion and Au for current carrying to and wire bonding or such as a Ti, Al, Pt metal layer sequence, which effective determines the metal resistivity $\rho_m$.

At least one embodiment adjusted for visible or ultraviolet nitride LEDs has mesh openings of 50 μm, fine mesh lines 5 μm wide and a metal layer thickness of 1 μm. The embodiment makes electrical contact to an LED with a single emission junction. The device operates at a current density $J_c$=500 A/cm^2 and a square die of size $L_{LED}$=1 mm, for a total current $I_0$=5 A, with an ideality factor of $\eta$=1.1. Within a mesh opening, the current crowding tolerance is $\eta_{cc}$=1%. The n-type GaN current spreading layer has a sheet resistivity of $R_s$=20Ω/☐, and the metal resistivity is approximately that of aluminum, $\rho_m$=2×10−6 Ωcm. In at least one embodiment, the metal mesh of FIG. 7 may comprise an areal coverage of $f_m$=10%. Additionally, at least one embodiment depicted in FIG. 7 for visible and ultraviolet nitride LEDs also includes a central bond pad for wire bonding and four thicker metal mesh lines of 20 μm widths extending from the bond pad to accommodate the distribution of larger currents across the device area without damaging the finer mesh lines.

At least one embodiment depicted by FIG. 7 for visible and ultraviolet nitride LEDs has parameters for contacting a particular LED device. The equations that describe the general embodiment include the variations in the parameters for different device parameters such as operating current, number of cascades, and sheet resistance of the semiconductor current spreading sheet resistivity.

Embodiments disclosed herein also include organic LEDs that emit light in the visible portion of the electromagnetic spectrum. These embodiments include LEDs with improved contacts comprised of combinations of metal-mesh semiconductor contacts and cascaded light emission stages.

The light emission stages may be junctions between layers comprised of light-emitting polymers or of light emitting organic molecules. FIG. 7 depicts an example mesh contact with material and geometric parameters adjusted for visible wavelength organic LEDs. The current spreading semiconducting layer of the embodiment may comprise indium-tin-oxide in combination with conductive and organic semiconducting compounds, having a sheet resistance of $R_s$=100Ω/☐. The Al-based lithographic metal mesh structure may comprise mesh openings of 25 μm.

Accordingly, implementation of the present invention provide designs and methods of design for optoelectric device that comprise improved performance. In particular, implementations of the present invention include mesh contact designs that increase current spreading.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectric device, comprising:
   a substrate;
   at least one junction configured to provide an active region within the substrate; and
   a metal-mesh semiconductor electrical contact structure attached to a surface of the substrate, wherein the metal-mesh semiconductor electrical contact structure comprises a plurality of mesh lines that define a grid of uniformly distributed mesh openings across the surface of the substrate,
   wherein the mesh openings comprise a mesh opening size,
   wherein the metal-mesh semiconductor electrical contact structure comprises a mesh thickness, and
   wherein the plurality of mesh lines comprises a first plurality of mesh lines that define rows and columns of the grid of uniformly distributed mesh openings having a first mesh line width and a second one or more thicker metal mesh lines having a second mesh line width thicker than the first mesh line width, the second one or more thicker metal mesh lines extending from a wire bonding pad.

2. The device of claim 1, wherein the grid of uniformly distributed mesh openings comprises a plurality of square mesh openings.

3. The device of claim 1, wherein the mesh thickness is configured such that a spreading length for a composite contact is greater than a size of the optoelectric device.

4. The device of claim 1, wherein the metal-mesh semiconductor electrical contact structure comprises an Au—Ti layer.

5. The device of claim 1, further comprising an n-type semiconductor current spreading contact layer comprising InAs.

6. The device of claim 1, further comprising a p-type semiconductor current spreading contact layer comprising GaSb.

7. The device of claim 1, further comprising cascaded LED emission junctions.

8. The device of claim 1, wherein the optoelectric device comprises semiconducting materials that emit light in a mid-infrared portion of the electromagnetic spectrum.

9. The device of claim 8, wherein the mesh opening size comprises a width of 50 μm, the first mesh line width comprises a width of 5 μm wide, and the mesh thickness comprises a thickness of 1 μm.

10. The device of claim 9, wherein the optoelectric device comprises ten cascaded junctions operating at a current density of 100 A/cm2, a square die with a length of 1 mm, and an ideality factor of 1.5.

11. The device of claim 1, wherein the optoelectric device comprises cascaded LED emission junctions that comprise semiconducting materials that emit light in a visible and ultraviolet portion of the electromagnetic spectrum.

12. The device of claim 11, wherein the mesh opening size comprises a width of 50 μm, the first mesh line width comprises a width of 5 μm wide, and the mesh thickness comprises a thickness of 1 μm.

13. The device of claim 12, wherein the optoelectric device operates at a current density of 500 A/cm2, and comprises a square die with a length of 1 mm, and an ideality factor of 1.1.

14. The device of claim 1, wherein the optoelectric device comprises cascaded organic LED emission junctions.

15. A light-emitting diode, comprising:
at least one substrate comprising a semiconducting material that emits light in a mid-infrared portion of the electromagnetic spectrum;
a plurality of cascaded LED emission junctions; and
a metal-mesh semiconductor electrical contact structure attached to a surface of the substrate, wherein the metal-mesh semiconductor electrical contact structure comprises a central-positioned wire bonding pad and a plurality of mesh lines that define a grid of uniformly distributed mesh openings across the surface of the substrate,
wherein the mesh openings have mesh opening sizes based on a number of junctions from the plurality of cascaded LED emission junctions,
wherein the metal-mesh semiconductor electrical contact structure comprises a plurality of uniform mesh thicknesses, and
wherein the plurality of mesh lines comprises a first plurality of mesh lines that define rows and columns of the grid of uniformly distributed mesh openings having a first mesh line width and a second one or more thicker metal mesh lines having a second mesh line width thicker than the first mesh line width, the second one or more thicker metal mesh lines extending from the central-positioned wire bonding pad.

16. The light-emitting diode of claim 15, wherein the semiconducting material comprises a material selected from a group consisting of InAs, GaSb, and AlSb.

17. The light-emitting diode of claim 15, wherein the plurality of uniform mesh opening sizes comprise widths of 50 μm, the first plurality of uniform mesh line widths comprise widths of 5 μm wide, and the plurality of uniform mesh thicknesses comprise thicknesses of 1 μm.

18. A method for manufacturing a metal-mesh semiconductor electrical contact structure for a light-emitting diode, the method comprising:
determining an operating current of the light-emitting diode;
determining a size of the light-emitting diode;
calculating a mesh thickness for the metal-mesh semiconductor electrical contact structure such that a spreading length for a composite contact is greater than the size of the light-emitting diode; and
creating the metal-mesh semiconductor electrical contact structure with the calculated mesh thickness, wherein the metal-mesh semiconductor electrical contact structure also comprises:
a plurality of mesh lines that define a grid of uniformly distributed mesh openings across a surface of a substrate and a central-positioned wire bonding pad, and wherein the plurality of mesh lines comprises a first plurality of mesh lines that define rows and columns of the grid of uniformly distributed mesh openings having a first mesh line width and a second one or more thicker metal mesh lines having a second mesh line width thicker than the first mesh line width, the second one or more thicker metal mesh lines extending from the central-positioned wire bonding pad.

19. The method of claim 18, further comprising configuring the metal-mesh semiconductor electrical contact structure to increase junction injection resistance compared to contact spreading resistance.

20. The method of claim 18, wherein the metal-mesh semiconductor electrical contact structure comprises a mesh opening width of 50 μm, a mesh line width of 5 μm wide, and a mesh thicknesses of 1 μm.

* * * * *